United States Patent [19]
Hoskins et al.

[11] Patent Number: 5,847,346
[45] Date of Patent: Dec. 8, 1998

[54] CONFIGURABLE ELECTRIC SWITCH FOR VEHICLE

[75] Inventors: Steven R. Hoskins, Walled Lake; Conrad M. Pastwa, Orion, both of Mich.

[73] Assignee: TRW Inc., Lyndhurst, Ohio

[21] Appl. No.: 820,604

[22] Filed: Mar. 19, 1997

[51] Int. Cl.⁶ .............................. H01H 9/02; H01H 9/58
[52] U.S. Cl. ...................................... 200/296; 200/11 TW
[58] Field of Search ..................... 200/5 A, 600, 200/11 TW, 16 D, 339, 294–296; 338/163–200, 128, 134

[56] References Cited

U.S. PATENT DOCUMENTS

| | | | |
|---|---|---|---|
| 3,566,049 | 2/1971 | Wright | 200/11 TW |
| 3,587,026 | 6/1971 | Puerner et al. | 338/128 |
| 4,027,620 | 6/1977 | Kirsch | 116/129 T |
| 4,055,738 | 10/1977 | Beck | 200/296 |
| 4,163,879 | 8/1979 | Mayer et al. | 200/11 TW |
| 4,190,749 | 2/1980 | Erickson et al. | 200/11 TW |
| 4,300,114 | 11/1981 | Sheridan et al. | 338/172 |
| 4,368,365 | 1/1983 | Jacquet | 200/11 TW |
| 4,523,175 | 6/1985 | Sakurai | 338/134 |
| 4,746,771 | 5/1988 | Koslar | 200/16 D |
| 4,758,702 | 7/1988 | Cummings | 200/339 |
| 4,769,626 | 9/1988 | Herrera | 338/185 |

*Primary Examiner*—J. R. Scott
*Attorney, Agent, or Firm*—Tarolli, Sundheim, Covell Tummino & Szabo

[57] ABSTRACT

An electric switch (20) for use in vehicle electric circuitry is mountable on a trim panel (30) of the vehicle. The switch (20) comprises a circuit board (60) having first and second electrical circuits (80, 100) which are electrically disconnected from each other. The switch (20) has a movable member (130) for controlling the operation of the first and second electrical circuits (80, 100). The apparatus also includes an electrically conductive jumper clip (50) that can be mounted at either a first location (44) or a second location (64) on the trim panel (30). The circuit board (60) includes first jumper terminals (84) engageable with the jumper clip (50) to enable the first circuit (80) when the jumper clip is mounted at the first location (44) on the trim panel (30). The circuit board (60) includes second jumper terminals (104) engageable with the jumper clip to enable the second circuit when the jumper clip (50) is mounted at the second location (64) on the trim panel (30).

12 Claims, 2 Drawing Sheets

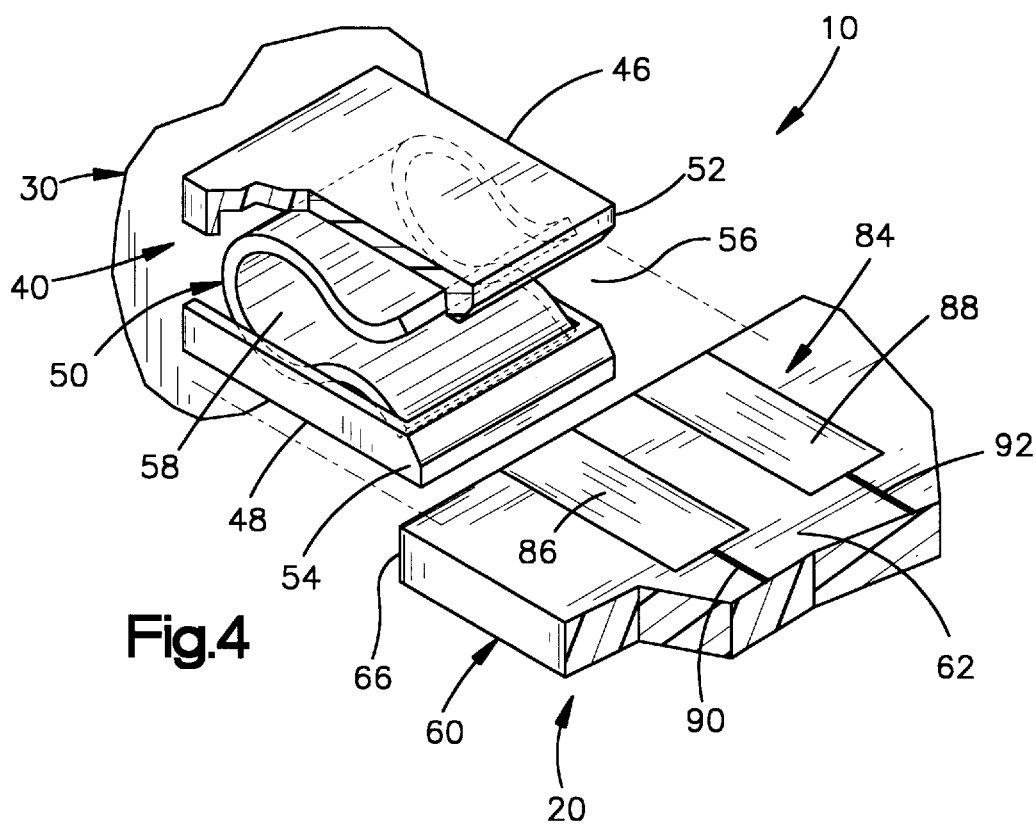
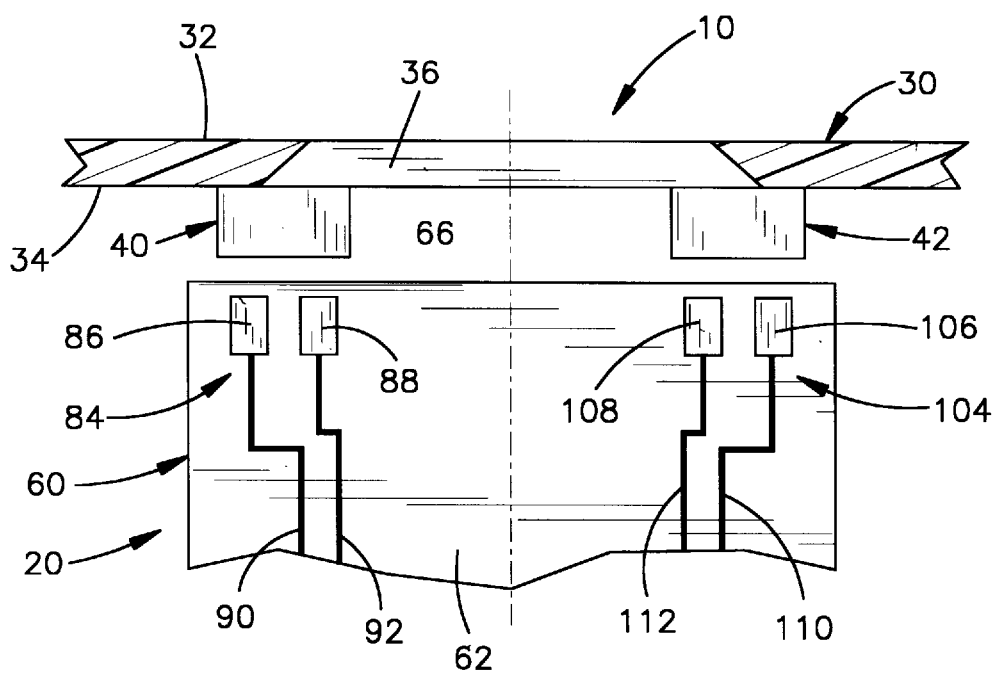

CONFIGURABLE ELECTRIC SWITCH FOR VEHICLE

BACKGROUND OF THE INVENTION

The present invention relates to an electric switch for a vehicle and, in particular, to an electric switch which can be selectively configured to enable a selected one of a plurality of different electrical circuits in the switch.

SUMMARY OF THE INVENTION

The present invention is an apparatus comprising an electric switch for use in vehicle electric circuitry. The switch includes a circuit board having first and second electrical circuits and includes a movable member for controlling the operation of the first and second electrical circuits. The switch is connectable with a vehicle trim panel. The apparatus includes means for selectively enabling the first circuit or the second circuit when the switch is connected with the trim panel.

In a preferred embodiment, the apparatus includes a jumper clip and means for selectively mounting the jumper clip at either a first location or a second location on the trim panel. The circuit board includes a first terminal which is engageable with the jumper clip to enable the first circuit when the jumper clip is mounted at the first location on the trim panel. The circuit board includes a second terminal which is engageable with the jumper clip to enable the second circuit when the jumper clip is mounted at the second location on the trim panel.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein:

FIG. 4 is an exploded perspective view showing a step in the assembly of the switch with the jumper clip and the trim panel; and FIG. 5 is a plan view showing a step in the assembly of the switch with the trim panel.

DESCRIPTION OF PREFERRED EMBODIMENTS

Figure 1:
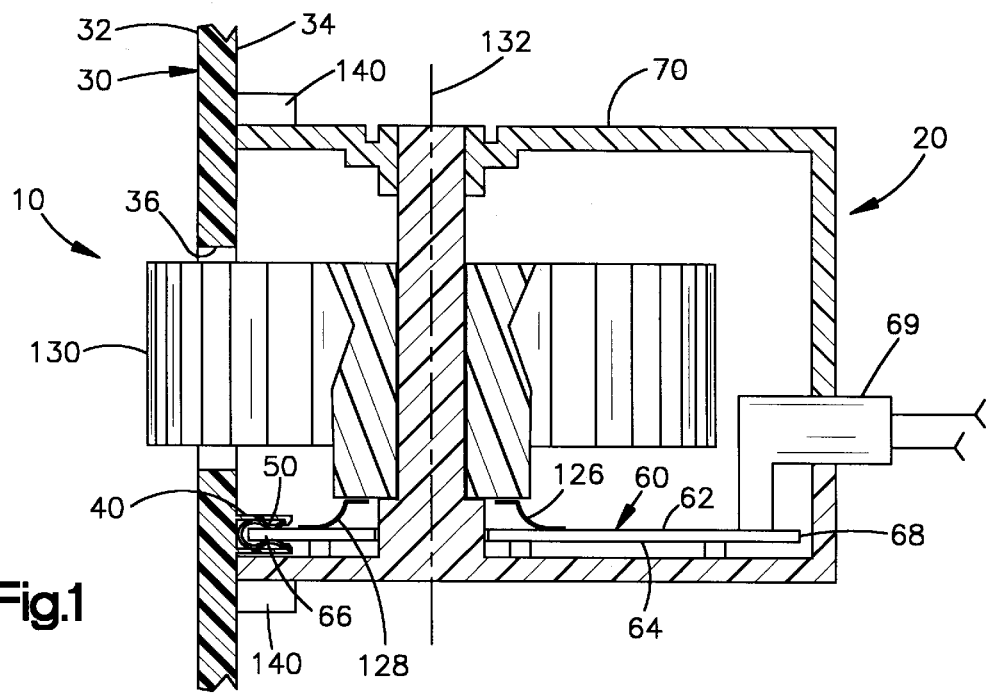
FIG. 1 is a sectional view of a switch assembly in accordance with the present invention including a switch, a trim panel, and a jumper clip.

The present invention relates to an electric switch for a vehicle and, in particular, to an electric switch which can be selectively configured to enable a selected one of a plurality of different electrical circuits in the switch. As representative of the present invention, FIG. 1 illustrates a switch assembly 10 including a switch 20 which is connectable with a trim panel 30.

The trim panel 30 forms a portion of the instrument panel 31 of a vehicle. The trim panel 30 has an outer side surface 32 which is presented toward the vehicle occupant compartment and an opposite inner side surface 34. A thumbwheel opening 36 in the trim panel 30 extends between the outer and inner side surfaces 32 and 34 of the trim panel.

The trim panel 30 includes a pair of jumper clip supports 40 and 42 (FIGS. 3 and 5) for selectively receiving an electrically conductive jumper clip 50 in a manner described below. The jumper clip supports 40 and 42 are disposed on the inner side surface 34 of the trim panel 30. The jumper clip supports 40 and 42 are preferably molded as one piece with the trim panel 30 from a suitable plastic material.

Figure 3:
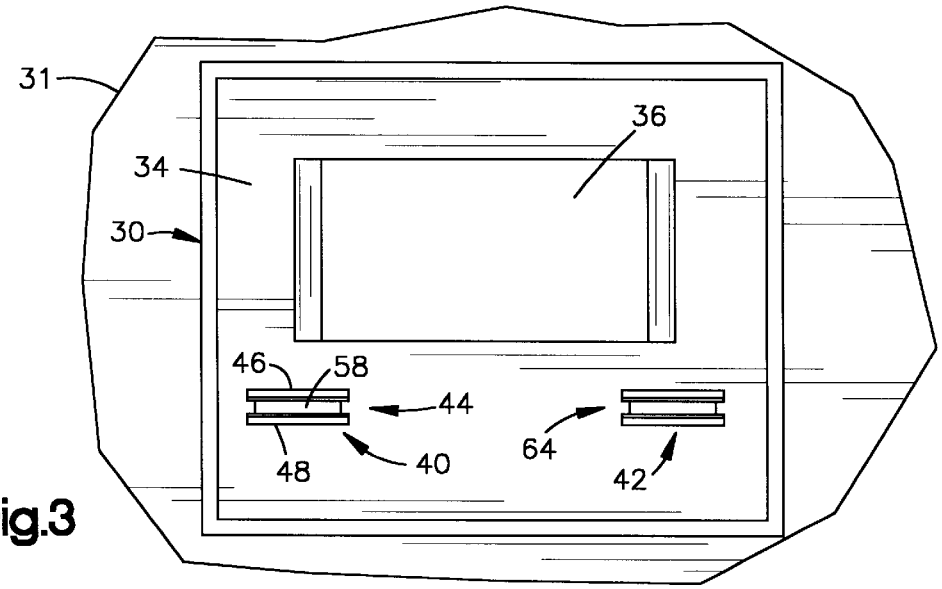
FIG. 3 is an elevational view of the trim panel of FIG. 1.

The first jumper clip support 40 projects inwardly (that is, in a direction to the right as viewed in FIG. 1) from the inner side surface 34 of the trim panel 30. The first jumper clip support 40 is disposed on the trim panel 30 at a first location indicated by the arrow 44 (FIG. 3).

The first jumper clip support 40 (FIG. 4) includes an upper arm 46 and a lower arm 48. The upper arm 46 and the lower arm 48 have respective leading edge portions 52 and 54 which define a passage 56. The passage 56 communicates with an opening 58 for receiving the jumper clip 50.

The second jumper clip support 42 is identical to the first jumper clip support 40. The second jumper clip support 42 is disposed on the trim panel 30 at a second location 64 (FIG. 3) spaced apart by a predetermined distance from the first location 44.

The switch 20 (FIG. 1) includes a circuit board 60 mounted in a housing 70. The circuit board 60 has first and second major side surfaces 62 and 64. The circuit board 60 has a leading edge 66 and an opposite trailing edge 68. An electrical connector 69 is mounted on the trailing edge 68 of the circuit board 60. The electrical connector 69 is connectable with vehicle electric circuitry (not shown) in a known manner to electrically connect the switch 20 with the vehicle electric circuitry.

First and second electrical circuits 80 and 100 (shown schematically in FIG. 2) are on the circuit board 60. In the embodiment being described, the electrical circuits 80 and 100 are electrically disconnected from each other. It should be understood that the electrical circuits 80 and 100 illustrated and described herein are only simple examples of the types of electrical circuits which can be included in a switch constructed in accordance with the present invention.

Figure 2:
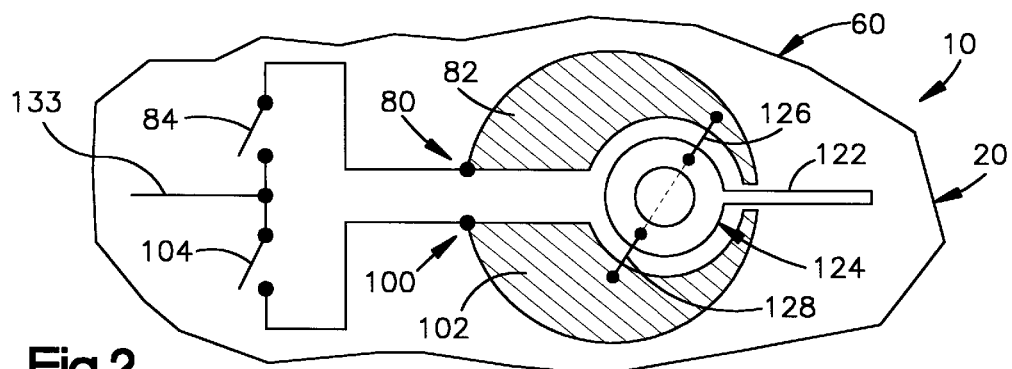
FIG. 2 is an electrical diagram of the switch of FIG. 1.

The first electrical circuit 80 includes a first thick film resistor 82 (FIG. 2). The first electrical circuit 80 also includes first jumper terminals 84 (FIGS. 4 and 5) which comprise first and second electrically conductive contact pads 86 and 88. The first and second contact pads 86 and 88 are spaced apart from each other on the circuit board 60. The first and second contact pads 86 and 88 are electrically connected with the other portions of the first circuit 80 by first and second conductive leads 90 and 92, respectively. When the first and second contact pads 86 and 88 are not electrically interconnected by the jumper clip 50, the first electrical circuit 80 is open, that is, is not enabled.

The second electrical circuit 100 (FIG. 2) includes a second thick film resistor 102. The second electrical circuit 100 also includes second jumper terminals 104 (FIGS. 2 and 5). The second jumper terminals 104 are spaced apart on the circuit board 60 from the first jumper terminals 84 by the same predetermined distance which separates the first and second jumper clip supports 40 and 42 on the trim panel 30.

The second jumper terminals 104 include third and fourth electrically conductive contact pads 106 and 108. The third and fourth contact pads 106 and 108 are spaced apart from each other on the circuit board 60. The third and fourth electrically conductive contact pads 106 and 108 are electrically connected with the other portions of the second circuit by third and fourth conductive traces 110 and 112, respectively. When the third and fourth contact pads 106 and 108 are not electrically interconnected by the jumper clip 50, the second electrical circuit 100 is open, that is, is not enabled.

The circuit board 60 includes a source of electric current indicated schematically by a conductor 122. The conductor 122 is electrically connected with an annular contact pad 124. A thumbwheel 130 is supported on the housing 70 for rotation about an axis 132 which extends transverse to the plane of the circuit board 60 and coaxial with the annular contact pad 124. The contact pad 124 surrounds the axis 132 of the thumbwheel 130.

Contactors 126 and 128 are joined to the thumbwheel 130 (as by heat stake riveting, for example) for rotation with the thumbwheel. Each of the contactors 126 and 128 has one leaf contact that resiliently rests in sliding contact against the annular contact pad 124 to establish electrical contact therewith. Alternatively, the contactors 126 and 128 may be part of a single annular or semi-annular contactor member, in which case only a single leaf contact with the contactor pad 124 need be provided.

The contactor 126 has a further leaf contact that resiliently rests in sliding contact against the thick film resistor 82. The contactor 128 similarly has a further leaf contact that resiliently rests in sliding contact against thick film resistor 102. The points of resistor contact of the leaf contacts of the contactors 126 and 128 are on diametrically opposed sides of the axis of rotation 132 of the thumbwheel 130.

The contactors 126 and 128 provide electrical contact between the conductor 122 and various points along the thick film resistors 82 and 102. The points of contact depend upon the rotational position of the thumbwheel 130. However, because of the configuration in FIG. 2 of the contacts and the resistors, clockwise rotation of the thumbwheel (as seen in FIG. 2) results in the reduction of the resistance through the resistor 102 but an increase in the resistance through the resistor 82. Thus, by selective connection of one or the other of the resistors 82 and 102 to the output terminal 133, the resistance characteristic of the switch 20 with respect to position of the thumbwheel 130 can be completely changed. This selective connection is accomplished through jumper arrangements 84 and 104.

The jumper arrangement 84 is provided between the resistor 82 and the output line 133. When the jumper arrangement 84 is closed, the resistor 82 is connected to the output line 133. When the jumper arrangement 84 is open, the resistor 82 is disconnected from the output line 133. Similarly, the jumper arrangement 104 is provided between the resistor 102 and the output line 133. When the jumper arrangement 104 is closed, the resistor 102 is connected to the output line 133. When the jumper arrangement 104 is open, the resistor 102 is disconnected from the output line.

More specifically, when the electrical gap between the first and second contact pads 86 and 88 of the first jumper terminals is closed as described below, the resistor 82 is connected to the output line 133 and the first electrical circuit 80 is thus completed or enabled. Electric current can then flow from the conductor 122, through the first resistor 82, and out through the output line 133.

Similarly, when the electrical gap between the third and fourth contact pads 106 and 108 of the second jumper terminals 104 is closed, the resistor 102 is connected to the output line 133 and the second electrical circuit 100 is thus completed or enabled. Electric current can then flow from the conductor 122, through the second resistor 102, and out through the output line 133.

Prior to mounting the switch 20 on the trim panel 30, the jumper clip 50 is selectively inserted in either the first jumper clip support 40 or the second jumper clip support 42. Specifically, the jumper clip 50, which is made from an electrically conductive material such as metal, is inserted in the first jumper clip support 40 if it is desired to complete or enable the first electrical circuit 80. The jumper clip 50 is inserted in the second jumper clip support 42 if it is desired to complete or enable the second electrical circuit 82.

The switch assembly 10 includes mounting means indicated schematically at 140 for mounting the switch 20 with the trim panel 30. The switch 20 is connected with the trim panel 30 by moving the switch in a direction to the left as viewed in FIGS. 1 and 4 (upward as viewed in FIG. 5). When the switch 20 engages the trim panel 30, the mounting means 140 secures the switch mechanically to the trim panel. The thumbwheel 130 on the switch 20 projects through the thumbwheel opening 36 in the trim panel 30.

When the jumper clip 50 is in the first jumper clip support 40, and the switch 20 is connected with the trim panel 30, the first jumper terminals 84 engage the jumper clip. Specifically, each of the first and second contact pads 86 and 88 on the circuit board makes electrical contact with the jumper clip 50. Because the jumper clip 50 is made from an electrically conductive material, the first and second contact pads 86 and 88 on the circuit board 60 are electrically interconnected by the jumper clip. As a result, electric current can flow between the first and second conductive traces 90 and 92, and the first electrical circuit 80 is completed or enabled. Rotation of the thumbwheel 130 therefore causes the current flowing through the conductor 122 to be modified by the first resistor 82 and not by the second resistor 102.

If it is desired to complete or enable the second electrical circuit 100, the jumper clip 50 is inserted in the second jumper clip support 42. When the jumper clip 50 is in the second jumper clip support 42, and the switch 20 is thereafter connected with the trim panel 30, the second jumper terminals 104 engage the jumper clip. Specifically, each of the third and fourth contact pads 106 and 108 on the circuit board 60 makes electrical contact with the jumper clip 50. Because the jumper clip 50 is made from an electrically conductive material, the third and fourth contact pads 106 and 108 on the circuit board 60 are electrically interconnected by the jumper clip. As a result, current can flow between the third and fourth conductive traces 110 and 112, and the second electrical circuit 100 is completed or enabled. Rotation of the thumbwheel 130 therefore causes the current flowing through the conductor 122 to be modified by the second resistor 102 and not by the first resistor 82.

From the above description of the invention, those skilled in the art will perceive improvements, changes and modifications in the invention. Such improvements, changes and modifications within the skill of the art are intended to be covered by the appended claims.

Having described the invention, we claim:

1. An apparatus comprising:

an electric switch for use in vehicle electric circuitry, said switch comprising a circuit board having first and second electrical circuits and said switch having a movable member for controlling the operation of an enabled one of said first and second electrical circuits, said first and second electrical circuits being electrically disconnected from each other, said switch being connectable with a vehicle trim panel; and means for selectively enabling said first circuit or said second circuit upon connecting said switch with the trim panel.

2. An apparatus as set forth in claim 1 wherein said means for selectively enabling comprises an electrically conductive jumper clip mountable at either a first location or a second location on the trim panel.

3. An apparatus as set forth in claim 2 wherein said circuit board includes a first terminal means which is engageable with the jumper clip to enable said first circuit when the jumper clip is mounted at a first location on the trim panel, said circuit board including a second terminal means which is engageable with the jumper clip to enable said second circuit when the jumper clip is mounted at a second location on the trim panel.

4. An apparatus as set forth in claim 3 wherein said first terminal means on said circuit board is spaced apart from said second terminal means on said circuit board by a first predetermined distance, the first location on the trim panel being spaced apart from the second location on the trim panel by said first predetermined distance.

5. An apparatus as set forth in claim 1 wherein the trim panel includes a first jumper clip support member disposed at a first location on the trim panel and a second jumper clip support member disposed at a second location on the trim panel spaced apart from said first location.

6. An apparatus as set forth in claim 1 wherein said circuit board includes first and second electrical contacts which are electrically interconnectable to enable said first circuit upon connecting said switch with the trim panel, said circuit board including third and fourth electrical contacts which are electrically interconnectable to enable said second circuit upon connecting said switch with the trim panel.

7. An apparatus comprising:

an electric switch mountable on a vehicle trim panel and for use in vehicle electric circuitry, said switch comprising a circuit board having first and second electrical circuits which are electrically disconnected from each other, said switch having a movable for controlling the operation of an enabled one of said first and second electrical circuits;

a jumper clip; and means for selectively mounting said jumper clip at either a first location or a second location on the trim panel;

said circuit board including a first terminal means which is engageable with said jumper clip to enable said first circuit when said jumper clip is mounted at the first location on the trim panel; and said circuit board including a second terminal means which is engageable with said jumper clip to enable said second circuit when said jumper clip is mounted at the second location on the trim panel.

8. An apparatus as set forth in claim 7 wherein said first terminal means comprises spaced apart first and second contact pads which are electrically disconnected from each other on said circuit board, said first and second contact pads being electrically interconnected by said jumper clip when said jumper clip is mounted at the first location on the trim panel and said switch is mounted on the trim panel.

9. An apparatus as set forth in claim 8 wherein said second terminal means comprises spaced apart third and fourth contact pads which are electrically disconnected from each other on said circuit board, said third and fourth contact pads being electrically interconnected by said jumper clip when said jumper clip is mounted at the second location on the trim panel and said switch is mounted on the trim panel.

10. An apparatus as set forth in claim 7 wherein said means for selectively mounting said jumper clip at either a first location or a second location on the trim panel comprises a first support member disposed at said first location and a second support member disposed at said second location on the trim panel, said first terminal means on said circuit board being spaced apart from said second terminal means on said circuit board by a first predetermined distance, said first support member being spaced apart from said second support member by said first predetermined distance.

11. An apparatus as set forth in claim 10 wherein said circuit board has a leading edge portion, said first and second terminal means being disposed on said leading edge portion of said circuit board, said circuit board being movable in a first direction to move said leading edge of said circuit board into engagement with said jumper clip.

12. An apparatus as set forth in claim 7 wherein said movable member comprises a rotatable knob which is manually engaged and rotatable by an occupant of the vehicle to control the operation of said first and second electrical circuits, said rotatable member being supported on said switch for rotation about an axis.

\* \* \* \* \*